US006965838B1

(12) United States Patent
Bandholz

(10) Patent No.: US 6,965,838 B1
(45) Date of Patent: Nov. 15, 2005

(54) APPARATUS HAVING IN-CIRCUIT FET ON-RESISTANCE CHARACTERIZATION

(75) Inventor: Justin Potok Bandholz, Cary, NC (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/855,122

(22) Filed: May 27, 2004

(51) Int. Cl.[7] .................... G01R 27/00; G01R 31/26
(52) U.S. Cl. .................... 702/65; 702/117; 324/525; 324/600; 324/769
(58) Field of Search .................... 702/57, 64, 65, 702/108, 117; 324/600, 601, 607, 649, 691, 324/769, 771, 763, 158.1, 523, 525; 713/340

(56) References Cited

U.S. PATENT DOCUMENTS

| 6,642,738 B2 | 11/2003 | Elbanhawy | |
|---|---|---|---|
| 2004/0148123 A1 * | 7/2004 | Abe | 702/120 |

FOREIGN PATENT DOCUMENTS

| JP | 07202219 A1 | 8/1995 |
|---|---|---|
| JP | 08068824 A1 | 3/1996 |
| JP | 11204609 A1 | 7/1999 |

* cited by examiner

Primary Examiner—Hal Wachsman
Assistant Examiner—Manuel L Barbee
(74) Attorney, Agent, or Firm—Jeanine S. Ray-Yarletts

(57) ABSTRACT

A computing system includes a semiconductor which sources current to load components within the system, a controllable load coupled to the semiconductor and having an on-state in which a predetermined current load is drawn from the semiconductor in addition to the load components, and a controller which couples the semiconductor and the controllable load. In this configuration, the controller senses the voltage across the semiconductor on at least three points in time. The controller activates the on-state of the controllable load during one of the three points in time and derives a first calculated voltage as a function of the three voltages sensed. The controller calculates the on-resistance of the semiconductor by dividing the first calculated voltage by the predetermined current.

20 Claims, 4 Drawing Sheets

APPARATUS HAVING IN-CIRCUIT FET ON-RESISTANCE CHARACTERIZATION

BACKGROUND OF THE INVENTION

This invention pertains to power conversion in computing systems and other systems which are able to benefit from accurate in-circuit device-resistance data and, more particularly, to a computer system having a power supply in which over-current and/or under-current trip points are adjusted based on FET on-resistance values which are derived while the power supply is actively supplying power to the components of the computer system.

In computer systems today it is common practice to measure the current on each voltage rail. These current measurements are used primarily to sense over-current conditions and other current conditions which require corresponding corrective action.

Sensing the current at the voltage rails typically involves the addition of a high precision resistor to sense the current that is flowing to the load components of the computer system. However, the addition of a precision resistor introduces two problems. First, precision resistors are expensive. Second, the precision resistor must be configured in series with the load in order to measure the current, and the resistor in the series configuration causes an additional undesirable voltage drop which generates undesirable heat in the system and derogates the efficiency of the system.

Some designs, notably certain PWM Controllers, have attempted to improve upon the above described series resistor design by eliminating the series resistor and instead utilizing the inherent resistance of the output device to measure the current. Unfortunately, this method has thus far remained relatively unreliable, imprecise, and inaccurate because the resistance changes with the age and type of output device. Thus, large margins must be designed-in to allow for these fluctuations and changes.

SUMMARY OF THE INVENTION

What is needed, therefore, is an apparatus and method which realizes output device current sensing in a more reliable manner by determining the resistance of the output device in-circuit. The measured resistance can then be used to adjust trip points or other functions for tighter control. Furthermore, what is needed is an apparatus and method which eliminates a series resistor while maintaining reliable, precise, and accurate on-resistance measurements.

Additionally, what is needed is an apparatus and method in which the same circuit can be used to support output devices having vastly different on-resistance values allowing for greater flexibility in design.

It has been discovered that the aforementioned challenges are addressed using a system and method which includes a semiconductor having an output node which sources current to a first load, a controllable load coupled to the output node of said semiconductor and having at least two controllable states of operation, including an on state in which a predetermined current load is drawn from the output node of said semiconductor, and a controller which couples the semiconductor and the controllable load. In this configuration, the controller senses the voltage across the output node of the semiconductor and a second node of said semiconductor on at least three points in time: T1, T2, and T3. The controller activates the on-state of the controllable load during T2 and derives a first calculated voltage as a function of the voltages sensed at T1, T2 and T3. The controller calculates the on-resistance of the semiconductor by dividing the first calculated voltage by the predetermined current.

The first calculated voltage is derived as the difference between the voltage sensed at T2 and a second calculated voltage which is a function of the voltages sensed at T1 and T3. Generally speaking, the second calculated voltage is interpolated based on the values of the voltages sensed at T1 and T3. However, where T2 is equally spaced between T1 and T3, the interpolation function required to calculate the second calculated voltage simplifies down to being the average of the voltages sensed at T1 and T3.

In one embodiment, the controller includes an over-current sensor which indicates an over-current condition as a function of the calculated on-resistance.

BRIEF DESCRIPTION OF THE DRAWINGS

Some of the purposes of the invention having been stated, others will appear as the description proceeds, when taken in connection with the accompanying drawings, in which.

DETAILED DESCRIPTION OF THE ILLUSTRATIVE EMBODIMENTS

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of this invention. Accordingly, the description which follows is to be understood as being a broad, teaching disclosure directed to persons of skill in the appropriate arts, and not as limiting upon the present invention.

Referring now more particularly to the accompanying drawings, in which like numerals indicate like elements or steps throughout the several views, a preferred embodiment of the present invention will be described. Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Figure 1:
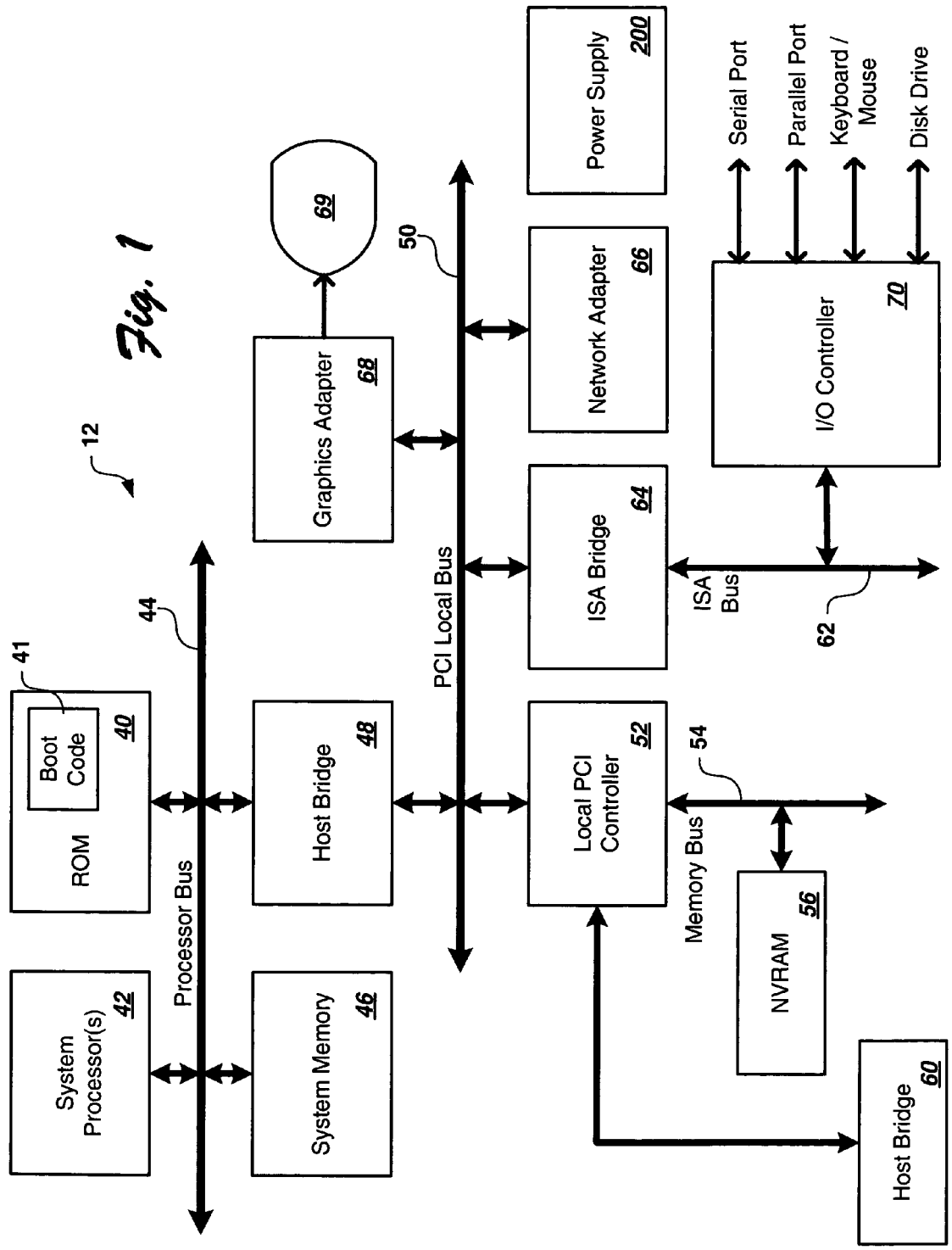
FIG. 1 is a block diagram of a computer system according to a preferred embodiment of the present invention which incorporates a power supply having in-circuit FET on-resistance characterization.

Referring now to FIG. 1, there is depicted a block diagram of an illustrative embodiment of a computer system 12 within enterprise computing environment 8. The illustrative embodiment depicted in FIG. 1 may be a desktop computer system, such as one of the Aptiva® series of personal computers, or a workstation computer, such as the RS/6000®, which are both manufactured by International Business Machines (IBM) Corporation of Armonk, N.Y.; however, as will become apparent from the following description, the present invention is applicable to the power conversion of any data processing system.

FIG. 1 is a block diagram of a computer system according to a preferred embodiment of the present invention which incorporates a power supply having in-circuit FET on-resistance characterization. As shown in FIG. 1, computer system 12 includes at least one system processor 42, which is coupled to a Read-Only Memory (ROM) 40 and a system memory 46 by a processor bus 44. System processor 42, which may comprise one of the PowerPC™ line of processors produced by IBM Corporation, is a general-purpose processor that executes boot code 41 stored within ROM 40 at power-on and thereafter processes data under the control of operating system and application software stored in system memory 46. System processor 42 is coupled via processor bus 44 and host bridge 48 to Peripheral Component Interconnect (PCI) local bus 50.

PCI local bus 50 supports the attachment of a number of devices, including adapters and bridges. Among these devices is network adapter 66, which interfaces computer system 12 to LAN 10, and graphics adapter 68, which interfaces computer system 12 to display 69. Communication on PCI local bus 50 is governed by local PCI controller 52, which is in turn coupled to non-volatile random access memory (NVRAM) 56 via memory bus 54. Local PCI controller 52 can be coupled to additional buses and devices via a second host bridge 60.

Computer system 12 further includes Industry Standard Architecture (ISA) bus 62, which is coupled to PCI local bus 50 by ISA bridge 64. Coupled to ISA bus 62 is an input/output (I/O) controller 70, which controls communication between computer system 12 and attached peripheral devices such as a keyboard, mouse, and disk drive (e.g., storage 14). In addition, I/O controller 70 supports external communication by computer system 12 via serial and parallel ports.

Computer system 12 further includes power supply 200 which sources power to the load components of computer system 12 including system processor 42, system memory 46, and graphics controller 68. Power supply 200 is a switching type power supply which is capable of characterizing the on-resistance of its onboard power MOSFET while the system is in operation (in-circuit). Knowing the actual on-resistance of the output stage MOSFET in-circuit allows for the setting of over-current and under-current threshold values or trip points based on actual on-resistance values.

Figure 2:
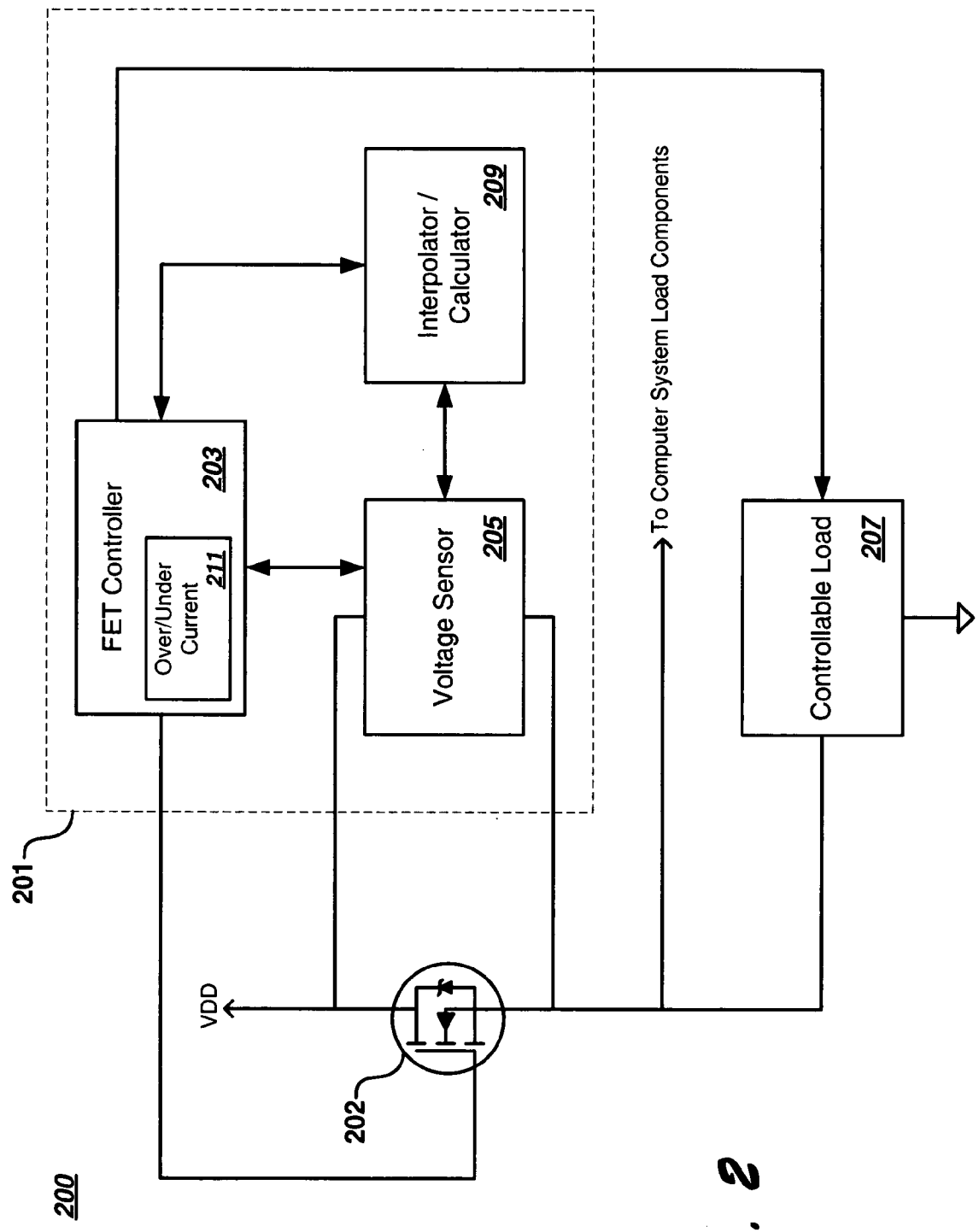
FIG. 2 is a block diagram of the power supply used in the computer system depicted in FIG. 1 according to a preferred embodiment of the invention.

FIG. 2 is a block diagram of the power supply 200 used in the computer system depicted in FIG. 1 according to a preferred embodiment of the invention. Power supply 200 includes output power MOSFET transistor 202, a power controller 201, and a controllable load 207. Output MOSFET 202 and controllable load 207 operate under the control of power controller 201, the details of which are to be described in more detail as the description ensues. Power output MOSFET 202 includes an output node, shown in FIG. 2 as the source node, which sources power to computer system load components such as system processor 42, system memory 46, and graphics controller 68, and which is connected to controllable load 207.

Controllable load 207 operates under the control of power controller 201 to add a known additional load current through output MOSFET 202. The additional load current causes an additional voltage drop which is then measured by power controller 201 as will be described in greater detail below. Controllable load 207 has two modes of operation. In an on-mode of controllable load 207, a known and predetermined current, for example 500 milliamps, is drawn from the output node of MOSFET 202. Thus, controllable load 207 can be implemented as a switchable current sink the details of which are within the skill of persons of ordinary skill in the art and thus the switchable current sink details will not be expanded upon herein so as to not obfuscate the application with unnecessary detail. Although an example of 500 milliamps is given, higher or lower values can be used without deviating from the principles outlined herein. In an off-mode, an insignificant amount of current is drawn from output MOSFET 202. Typically, this insignificant current is on the order of five milliamps or less, but can be much higher and still give more accurate measurement of on-resistance than other known methods. For example, in the off-mode, the insignificant amount can be as high as 10 percent of the predetermined current and the circuits shown herein still give acceptable results. Thus, for the exemplary value of the on-mode current of 500 milliamps, the insignificant off-mode current can be as high as 50 milliamps.

Power controller 201 enables the controllable load 207 while the computer system load components are active and operational. Thus, in the on-mode of operation, the predetermined current of controllable load 207 is induced in parallel to the load currents from the computer system components; stated differently, controllable load 207, when activated, is an additional load.

Power controller 201 is comprised of FET controller 203, voltage sensor 205, and interpolator/calculator 209. FET controller 203 controls the overall functionality of the circuit as described herein and includes a microprocessor which includes firmware code to perform that overall functionality. Alternatively, the logical functions of FET controller 203 can be implemented as a microcontroller, a state machine, or as discrete circuits.

Voltage sensor 205 senses the voltage drop across the drain and source nodes of MOSFET 202 in-circuit and provides a voltage value output to interpolator/calculator 209. In the example shown in FIG. 2, voltage sensor 205 is an analog-to-digital converter so as to provide digital data to interpolator/calculator 209. Voltage sensor 205 can alternatively be implemented in the analog realm by any of the known op-amp methods for other embodiments where the analog digital converter is elsewhere in the circuit. For the most part, details concerning analog to digital converters and op-amp methods and the like have been omitted in as much as such details are not necessary to obtain a complete understanding of the present invention and are within the skills of persons of ordinary skill in the relevant art. For example, standard A/D's or op-amps can be used without alteration. In the alternative analog embodiment, the op-amp circuits chosen for voltage sensor 205 can be of the ground voltage reference type or of the differential voltage type depending on the input requirements of interpolator/calculator 209.

FET controller 203 also contains over-current and under-current circuits 211 which contain over-current and under-current thresholds or trip points which are based on the on-resistance of MOSFET 202. Prior to any auto calibration, these threshold points are loaded with an expected value of on-resistance for MOSFET 202. These threshold values are then updated in-circuit according to the operation of FET controller 203, interpolator/calculator 209, voltage sensor 205, controllable load 207, and MOSFET 202 as shall now be described. Although over-current and under-current circuits to 211 are shown to be implemented in hardware, circuits 211 may alternatively be implemented in firmware by implementing over-current and under-current thresholds as a voltage thresholds which are compared to samples taken by voltage sensor 205.

Interpolator/calculator 209 is implemented as a DSP and is responsible for performing the math calculations needed to convert the voltage measurements taken from voltage sensor 205 to on-resistance values suitable for deriving over-current and under-current threshold values. These on-resistance calculations will be explained in further detail below. While shown as a DSP, interpolator/calculator 209 can be implemented as a standard microprocessor or microcontroller and indeed can be implemented within FET controller 203 if the microprocessor therein has enough spare bandwidth to make the calculations of interpolator/calculator 209 without impacting the switching operation accuracy of MOSFET 202. Interpolator/calculator 209 and voltage sensor 205 operate under the control of FET controller 203 as shall now be described with reference to FIG. 3.

Figure 3:
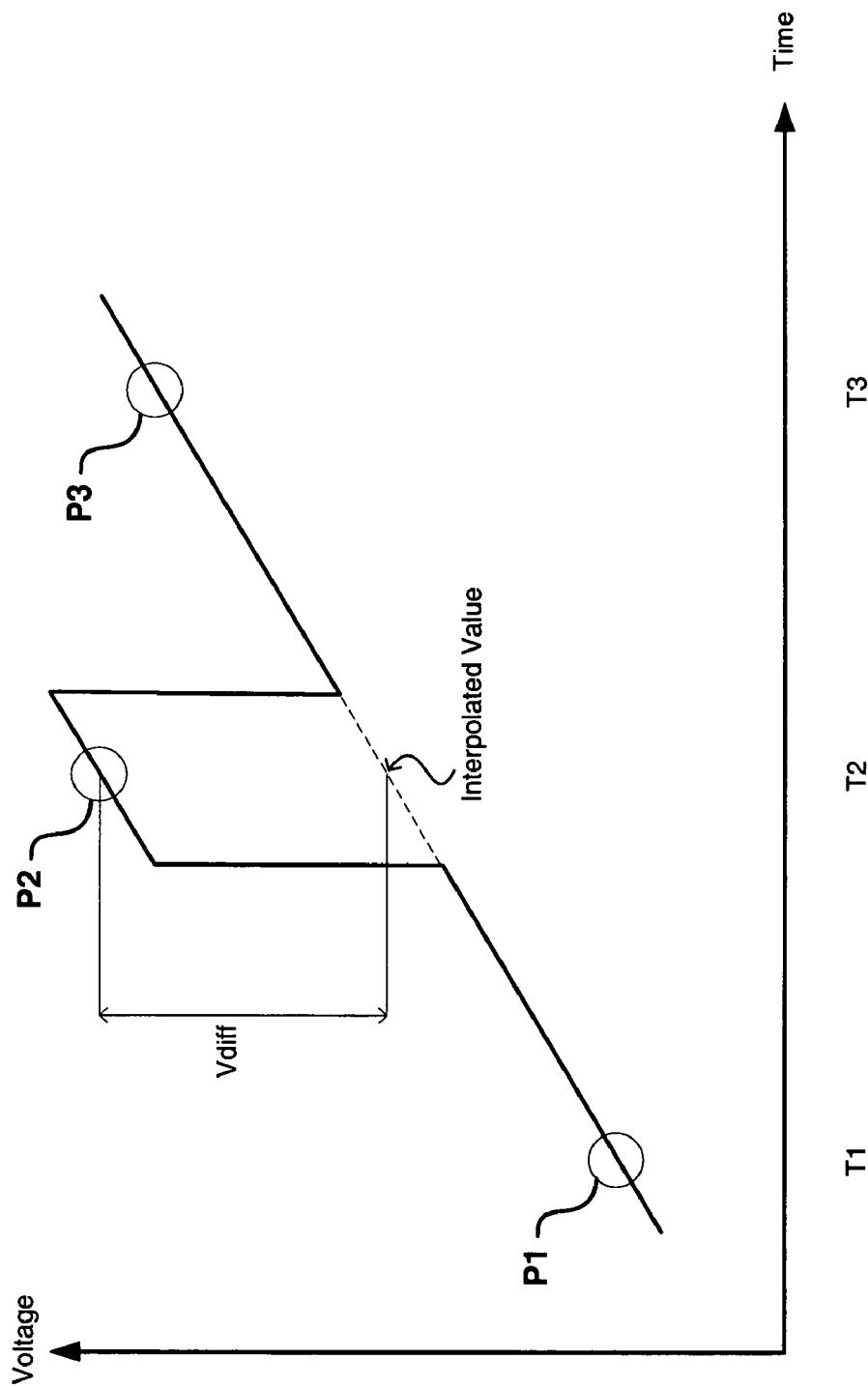
FIG. 3 is a graphical representation of the current flowing through the load components of the computer system depicted in FIG. 1, wherein, during the time surrounding T2, a controlled current is activated in order to take in-circuit on-resistance measurements.

FIG. 3 is a graphical representation of the current flowing through the load components of the computer system depicted in FIG. 1, wherein, during the time surrounding T2, a controlled current is activated in order to take in-circuit on-resistance measurements. The programmatic steps taken by the microprocessor of FET controller 203 and by the DSP of interpolator/calculator 209 shall now be explained in more detail. Initially, FET controller 203 pre-assigns an on-resistance value for MOSFET 202 based on manufacturer specifications. With this preassigned on-resistance value, over-current and under-current circuits 211 are assigned threshold values or trip points accordingly. After FET controller 203 fully biases MOSFET 202, auto calibration begins. First, FET controller 203 instructs voltage sensor 205 to take the sample denoted on FIG. 3 as P1 at time T1. During sample P1 taken at time T1, FET controller 203 instructs controllable load 207 to operate in the off-mode such that an insignificant amount of additional current is added. Once voltage sensor 205 completes its analog to digital conversion process, interpolator/calculator 209 is instructed by FET controller 203 to store sample P1 and its corresponding sample time T1. Then, prior to taking the sample at time T2, FET controller 203 instructs controllable load 207 to operate in the on-mode of operation in which the additional load of 500 milliamps is applied. FET controller 203 then instructs voltage sensor 205 to take the sample P2 at time T2 during which the additional current is added by controllable load 207. Once voltage sensor 205 completes its analog to digital conversion process, interpolator/calculator 209 is instructed by FET controller 203 to store sample P2 and its corresponding sample time T2. A similar process is executed for sample P3 at time T3 with controllable load 207 set to the off-mode.

With sample data P1/T1, P2/T2, and P3/T3, interpolator/calculator 209 is an instructed by FET controller 203 to derive a first calculated voltage, designated in FIG. 3 as Vdiff, which is calculated as the difference between the voltage P2 sensed at T2 and a second calculated voltage which is interpolated based on the values of the voltages P1 and P3 sensed at T1 and T3, and calculates the on-resistance of MOSFET 202 by dividing the Vdiff by the predetermined current of 500 ma. The interpolated value itself is calculated by interpolator/calculator 209 according to the following equations in which P(i) is designated as the interpolated value:

$$P(i)=P1*((T3-T2)/(T3-T1))+P2*((T2-T1)/(T3-T1)).$$

Thus, in a simplified example, if P1 and P3 are 1 and 3 Volts respectively, and if T1, T2, T3 are 5 ms, 10 ms, and 15 ms respectively, the intervals between T1 T2 and T3 are equal and thus the above equation simplifies to being an average between 1 and 3 volts, or 2 volts as follows:

$$P(i)=1*((15-10)/(15-5))+3*((10-5)/(15-5))=2 \text{ volts}.$$

By interpolating in this fashion, the current load drawn by the load components of computer system 12 including system processor 42, system memory 46, and graphics controller 68 need not remain constant during the calibration period.

Figure 4:
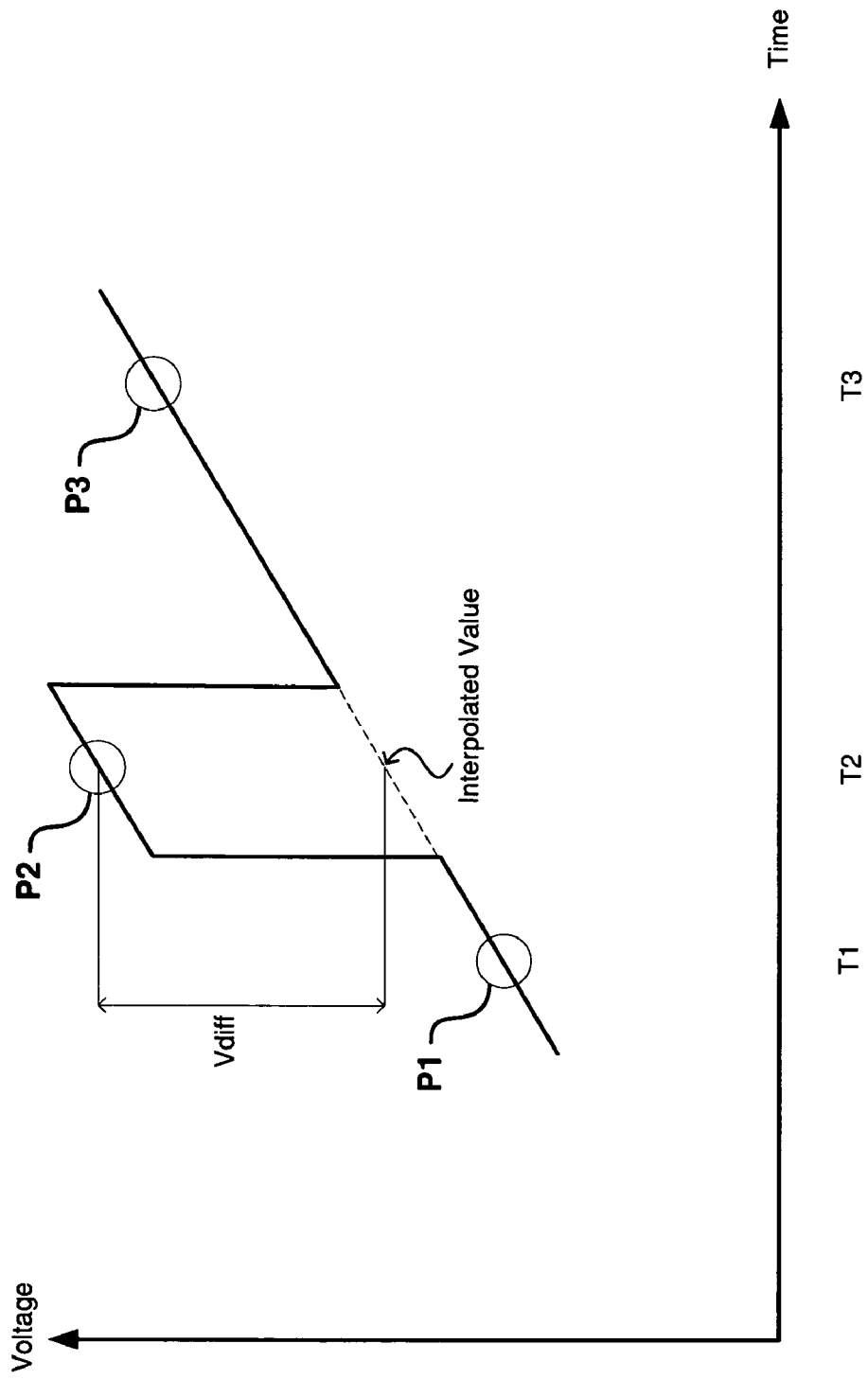
FIG. 4 is a graphical representation of current flow as in FIG. 3 wherein the time intervals between sample points are unequal.

FIG. 4 is a graphical representation of current flow as in FIG. 3 wherein the time intervals between sample points are unequal. In this example, P1 and P3 are also presumed to be 1 and 3 Volts respectively, and T1, T2, T3 are 7.5 ms, 10 ms, and 15 ms respectively. In this case, the interpolated value P(i) is appropriately weighted toward P1 as follows:

$$P(i)=1*((15-10)/(15-7.5))+3*((10-7.5)/(15-7.5))$$
$$=1.667 \text{ volts}.$$

P(i) is then used by interpolator/calculator 209 to derive Vdiff by subtracting P(i) from P2 as Vdiff=P2−P(i). The on-resistance of MOSFET 202 is then calculated by interpolator/calculator 209 by dividing Vdiff by 500 ma as R=Vdiff/500 ma. The on-resistance R is then used by FET controller 203 to establish trip points in over-current and under-current circuits 211.

Alternatively, where the samples can be limited to times T1, T2, and T3 in which T2 is equally spaced between T1 and T3, interpolator/calculator 209 can be implemented in a simpler fashion as an averaging circuit. In this case, interpolator/calculator 209 need not implement T1, T2, and T3 as variables and can implement a straight average between samples P1 and P3 in calculating the interpolated value P(i).

While the example above takes a single sample at each of sample times T1, T2, and T3, in one embodiment, various samples can be taken on and around each of T1, T2, and T3 to give a more robust result. The number samples taken and the time between samples are chosen to reduce jitter and errors caused by load transients. Likewise, entire calibration runs can be executed and averaged over time to obtain a highly robust and accurate value for the on-resistance and for variables depending therefrom.

In the drawings and specifications there has been set forth a preferred embodiment of the invention and, although specific terms are used, the description thus given uses terminology in a generic and descriptive sense only and not for purposes of limitation.

What is claimed is:

1. Apparatus comprising:
   a semiconductor having an output node which sources current to a first load;
   a controllable load coupled to the output node of said semiconductor and having at least two controllable states of operation including an on state in which a predetermined current load is drawn from the output node of said semiconductor in addition to the first load; and
   a controller which is coupled to said semiconductor and said controllable load and which (1) senses the voltage across the output node of said semiconductor and a second node of said semiconductor on at least three points in time designated herein as T1, T2, and T3 wherein the controller
(2) activates the on state of said controllable load during T2 and
(3) derives a first calculated voltage as a function of the voltages sensed at T1, T2 and T3 and
(4) calculates the on-resistance of said semiconductor by dividing the first calculated voltage by the predetermined current.

2. Apparatus of claim 1 wherein the first calculated voltage is derived as the difference between the voltage sensed at T2 and a second calculated voltage which is a function of the voltages sensed at T1 and T3.

3. Apparatus of claim 2 wherein the second calculated voltage is interpolated based on the values of the voltages sensed at T1 and T3.

4. Apparatus of claim 3 wherein said controller includes an over-current sensor which indicates an over-current condition as a function of the calculated on-resistance.

5. Apparatus of claim 1 wherein the first load is a variable load and wherein T2 is equally spaced between T1 and T3 and wherein the first calculated voltage is derived as the difference between the voltage sensed at T2 and the average of the voltages sensed at T1 and T3.

6. Apparatus of claim 1 wherein said controller includes an over-current sensor which indicates an over-current condition as a function of the calculated on-resistance.

7. A method comprising:
sensing voltages appearing across an output node of a semiconductor and a second node of the semiconductor on at least three points in time designated as T1, T2, and T3 in which the semiconductor is sourcing current to a first load;
inducing a predetermined current load during T2, the predetermined current load being additional to the first load;
deriving a first calculated voltage as a function of the voltages sensed at T1, T2 and T3 and
calculating the on-resistance of the semiconductor by dividing the first calculated voltage by the predetermined current.

8. The method of claim 7 wherein the first calculated voltage is derived as the difference between the voltage sensed at T2 and a second calculated voltage which is a function of the voltages sensed at T1 and T3.

9. The method of claim 8 wherein the second calculated voltage is interpolated based on the values of the voltages sensed at T1 and T3.

10. Apparatus comprising:
an FET having an output node which sources current to a first variable load;
a controllable load coupled to the output node of said FET having at least two controllable states of operation including an off state, in which an insignificant amount of current is drawn from the output node of said FET, and an on state, in which a predetermined current load is drawn from the output node of said FET in addition to the first variable load;
a voltage sensor which is coupled to the output node of said FET and to a second node of said FET and which senses the voltage across the output node and the second node of said FET;
an interpolator which is coupled to said voltage sensor and which derives a first calculated voltage as a function of the voltages sensed by said voltage sensor; and an FET controller which is coupled to the gate node of said FET and to said controllable load, said voltage sensor, and said interpolator and which controls the current to the first variable load by discretely switching said FET between a low on-resistance state and a high resistance state;
wherein said voltage sensor is activated under the control of the said FET controller to sense the voltage on at least three points in time designated herein as T1, T2, and T3,
and wherein said controller activates the off state of said controllable load during T1 and T3 and activates the on state of said controllable load during T2,
and wherein said interpolator (1) derives the first calculated voltage which is calculated as the difference between the voltage sensed at T2 and a second calculated voltage which is interpolated based on the values of the voltages sensed at T1 and T3, and (2) calculates the on-resistance of said FET by dividing the first calculated voltage by the predetermined current.

11. Apparatus of claim 10 wherein said FET controller includes an over-current sensor which indicates an over-current condition, wherein a trip point for the over-current sensor is set as a function of the calculated on-resistance.

12. Apparatus of claim 11 wherein the insignificant amount of current is less than one tenth of the predetermined current.

13. Apparatus comprising:
a processor, memory, and graphics controller;
a semiconductor having an output node which sources current to said processor, memory, and graphics controller;
a controllable load coupled to the output node of said semiconductor and having at least two controllable states of operation including an on state in which a predetermined current load is drawn from the output node of said semiconductor in addition to the current sourced to said processor, memory, and graphics controller; and
a controller which is coupled to said semiconductor and said controllable load and which
(1) senses the voltage across the output node of said semiconductor and a second node of said semiconductor on at least three points in time designated herein as T1, T2, and T3 wherein the controller
(2) activates the on state of said controllable load during T2 and
(3) derives a first calculated voltage as a function of the voltages sensed at T1, T2 and T3 and
(4) calculates the on-resistance of said semiconductor by dividing the first calculated voltage by the predetermined current.

14. Apparatus of claim 13 wherein the first calculated voltage is derived as the difference between the voltage sensed at T2 and a second calculated voltage which is a function of the voltages sensed at T1 and T3.

15. Apparatus of claim 14 wherein the second calculated voltage is interpolated based on the values of the voltages sensed at T1 and T3.

16. Apparatus of claim 15 wherein said controller includes an over-current sensor which indicates an over-current condition as a function of the calculated on-resistance.

17. Apparatus comprising:
a processor, memory, and graphics controller;
an FET having an output node which sources current to said processor, memory, and graphics controller;

a controllable load coupled to the output node of said FET having at least two controllable states of operation including an off state, in which an insignificant amount of current is drawn from the output node of said FET, and an on state, in which a predetermined current load is drawn from the output node of said FET in addition to the current sourced to said processor, memory, and graphics controller;

a voltage sensor which is coupled to the output node of said FET and to a second node of said FET and which senses the voltage across the output node and the second node of said FET;

an interpolator which is coupled to said voltage sensor and which derives a first calculated voltage as a function of the voltages sensed by said voltage sensor; and an FET controller which is coupled to the gate node of said FET and to said controllable load, said voltage sensor, and said interpolator and which controls the current to said processor, memory, and graphics controller by discretely switching said FET between a low on-resistance state and a high resistance state;

wherein said voltage sensor is activated under the control of the said FET controller to sense the voltage on at least three points in time designated herein as T1, T2, and T3, and wherein said controller activates the off state of said controllable load during T1 and T3 and activates the on state of said controllable load during T2, and wherein said interpolator (1) derives the first calculated voltage which is calculated as the difference between the voltage sensed at T2 and a second calculated voltage which is interpolated based on the values of the voltages sensed at T1 and T3, and (2) calculates the on-resistance of said FET by dividing the first calculated voltage by the predetermined current.

18. Apparatus of claim 17 wherein said FET controller includes an over-current sensor which indicates an over-current condition, wherein a trip point for the over-current sensor is set as a function of the calculated on-resistance.

19. Apparatus of claim 18 wherein the insignificant amount of current is less than one tenth of the predetermined current.

20. Apparatus of claim 19 wherein the interpolation is taken as an average of the values of the voltages sensed at T1 and T3.

* * * * *